(12) United States Patent
Kim et al.

(10) Patent No.: US 7,553,724 B2
(45) Date of Patent: Jun. 30, 2009

(54) METHOD FOR MANUFACTURING CODE ADDRESS MEMORY CELL BY WHICH A STACK INSULATING FILM OF AN OXIDE FILM AND A NITRIDE FILM USED AS A DIELECTRIC FILM IN A FLASH MEMORY IS USED AS A GATE OXIDE FILM

(75) Inventors: Jum Soo Kim, Kyungki-Do (KR); Sung Mun Jung, Kyungki-Do (KR); Min Kuck Cho, Kyungki-Do (KR); Young Bok Lee, Kyungki-Do (KR)

(73) Assignee: Hynix Semiconductor Inc., Ichon-Shi, Kyungki-Do (KR)

( * ) Notice: Subject to any disclaimer, the term of this patent is extended or adjusted under 35 U.S.C. 154(b) by 0 days.

(21) Appl. No.: 10/029,394

(22) Filed: Dec. 28, 2001

(65) Prior Publication Data
US 2002/0197777 A1   Dec. 26, 2002

(30) Foreign Application Priority Data
Jun. 26, 2001   (KR) ............................... 2001-36726

(51) Int. Cl.
*H01L 21/336* (2006.01)
(52) U.S. Cl. ............... 438/257; 438/261; 257/E21.422; 257/E21.683
(58) Field of Classification Search ................. 438/211, 438/257, 263, 264, 142, 258, 756, 757, 151, 438/197, 585, 201, 288, 573, 652, FOR. 212, 438/261, FOR. 431; 257/314–326, E27.078, 257/E29.3, E29.17, 261, E29.129, E21.422, 257/E21.68, E21.687, E21.688, E21.683
See application file for complete search history.

(56) References Cited

U.S. PATENT DOCUMENTS

| | | | | | |
|---|---|---|---|---|---|
| 5,089,866 | A | * | 2/1992 | Iwasa | ........................... 257/69 |
| 5,138,410 | A | * | 8/1992 | Takebuchi | .................... 257/314 |
| 5,412,600 | A | * | 5/1995 | Nakajima | .............. 365/185.17 |
| 5,604,698 | A | * | 2/1997 | Bergemont | ............ 365/185.01 |
| 5,739,567 | A | * | 4/1998 | Wong | .......................... 257/316 |
| 5,981,403 | A | * | 11/1999 | Ma et al. | ..................... 438/758 |
| 5,981,404 | A | * | 11/1999 | Sheng et al. | ................. 438/791 |
| 5,994,733 | A | * | 11/1999 | Nishioka et al. | ............. 257/316 |

(Continued)

FOREIGN PATENT DOCUMENTS

JP   01-125982   5/1989

(Continued)

*Primary Examiner*—Matthew Smith
*Assistant Examiner*—Khiem D. Nguyen
(74) *Attorney, Agent, or Firm*—Lowe Hauptman Ham & Berner, LLP

(57) ABSTRACT

The present invention relates to a method manufacturing a code address memory (CAM) cell. The present invention uses a dielectric film in which an oxide film and a nitride film between a floating gate and a control gate in a flash memory cell are stacked as a gate insulating film between a semiconductor substrate and a gate in the CAM cell. Therefore, the present invention can reduce the area of a peripheral circuit region and stably secure repaired data since the CAM cell can be stably driven at a low operating voltage and additional boosting circuit is thus not required.

9 Claims, 4 Drawing Sheets

U.S. PATENT DOCUMENTS

| | | | | |
|---|---|---|---|---|
| 6,091,636 A * | 7/2000 | Liu et al. | ............... | 365/185.19 |
| 6,235,585 B1 * | 5/2001 | Lee et al. | .................... | 438/258 |
| 6,265,266 B1 * | 7/2001 | Dejenfelt et al. | ............ | 438/258 |
| 6,274,430 B1 * | 8/2001 | Jan et al. | .................... | 438/258 |
| 6,291,853 B1 * | 9/2001 | Io | .............................. | 257/315 |
| 6,316,293 B1 * | 11/2001 | Fang | .......................... | 438/142 |
| 6,330,187 B1 * | 12/2001 | Choi et al. | ............. | 365/185.15 |
| 6,350,707 B1 * | 2/2002 | Liu et al. | .................... | 438/791 |
| 6,417,086 B1 * | 7/2002 | Osari | .......................... | 438/594 |
| 6,417,538 B1 * | 7/2002 | Choi | ........................... | 257/315 |
| 6,445,030 B1 * | 9/2002 | Wu et al. | .................... | 257/315 |
| 6,461,984 B1 * | 10/2002 | Han et al. | .................. | 438/788 |
| 6,482,697 B1 * | 11/2002 | Shirai | .......................... | 438/257 |
| 6,506,676 B2 * | 1/2003 | Park et al. | .................. | 438/683 |
| 6,518,619 B2 * | 2/2003 | Verhaar et al. | .............. | 257/316 |
| 6,597,047 B2 * | 7/2003 | Arai et al. | .................. | 257/411 |
| 6,667,511 B1 * | 12/2003 | Fang | .......................... | 257/321 |
| 6,787,840 B1 * | 9/2004 | Pham et al. | ................. | 257/313 |
| 6,828,194 B2 * | 12/2004 | Chan et al. | .................. | 438/257 |
| 6,838,345 B2 * | 1/2005 | Chang | ........................ | 438/261 |
| 6,885,070 B2 * | 4/2005 | Yi et al. | ...................... | 257/381 |
| 7,026,681 B2 * | 4/2006 | Ohmi et al. | .................. | 257/314 |
| 2001/0026968 A1 * | 10/2001 | Sung et al. | .................. | 438/200 |
| 2002/0000602 A1 * | 1/2002 | Lee | ............................. | 257/314 |
| 2002/0025691 A1 * | 2/2002 | Ohmi et al. | .................. | 438/787 |
| 2002/0045320 A1 * | 4/2002 | Choi et al. | ................... | 438/303 |
| 2003/0102503 A1 * | 6/2003 | Rabkin et al. | ................ | 257/315 |
| 2003/0206447 A1 * | 11/2003 | Tuan et al. | ............. | 365/185.33 |
| 2004/0227179 A1 * | 11/2004 | Rabkin et al. | ................ | 257/315 |

FOREIGN PATENT DOCUMENTS

| | | |
|---|---|---|
| JP | 05-021808 | 1/1993 |
| JP | 04-005847 | 1/1995 |
| JP | 07-183411 | 7/1995 |
| JP | 08-236646 | 9/1996 |
| JP | 11-008325 | 1/1999 |
| JP | 2000-132984 | 5/2000 |

\* cited by examiner

METHOD FOR MANUFACTURING CODE ADDRESS MEMORY CELL BY WHICH A STACK INSULATING FILM OF AN OXIDE FILM AND A NITRIDE FILM USED AS A DIELECTRIC FILM IN A FLASH MEMORY IS USED AS A GATE OXIDE FILM

BACKGROUND OF THE INVENTION

1. Field of the Invention

The invention relates generally to a method of manufacturing a code address memory (called CAM) cell, and more particularly to, a method of manufacturing a CAM cell by which a stack insulating film of an oxide film and a nitride film used as a dielectric film in a flash memory cell is used as a gate oxide film.

2. Description of the Prior Art

A flash memory cell is used to store an ID of a manufacturing company, a serial number, and the like using a non-volatile characteristic of a flash memory device. Also, in the flash memory device, in order to prevent deletion of information by unauthorized users, that is, in order to store protection information and un-protection information for protecting a specific memory region in which code information or the like is stored, a CAM cell circuit is inserted into a peripheral circuit region, as shown in FIG. 1.

The CAM cell used for the above purpose is generally used for repair data or protection function. Data must be easily read out from the CAM cell even at a supply power (Vcc) during a normal read operation. The CAM cell, however, includes a flash memory cell used as a main cell.

A method of manufacturing the flash memory cell used as the CAM cell as well as the main cell will be below described by reference to FIG. 2. A tunnel oxide film 12 and a first polysilicon film 13 are first formed on a semiconductor substrate 11. The tunnel oxide film 12 and the first polysilicon film 13 are then patterned to form a floating gate. Next, a dielectric film 14 and a second polysilicon film 15 are formed on the entire surface. At this time, an ONO film in which a first oxide film, a nitride film and a second oxide film are stacked is generally used as a dielectric film 14. A given region from the second polysilicon film 15 to the tunnel oxide film 12 is patterned to form a stack gate in which the floating gate and a control gate are stacked. Thereafter, a source region 16 and a drain region 17 are formed on the semiconductor substrate 11 by means of impurity ion implantation process.

In the above flash memory cell, cells are programmed or erased by charging and discharging electric charges into and from the floating gate In order to perform a read-out operation for finding the program or erasure of the flash memory cell or the state of the flash memory cell, a given voltage must be applied. In other words, as shown in FIG. 3, different levels of a control gate voltage $V_{CG}$, a source voltage $V_S$, a substrate voltage $V_B$ and a drain voltage $V_D$ must be applied for respective operations of the flash memory cell.

The above flash memory cell must have a given thickness of the tunnel oxide film and the dielectric film in order to store information for about ten years. In higher-integrated next-generation semiconductor devices, it is difficult to reduce the cell vertically. Therefore, in view of the storage capacity of the cell, it is difficult to increase the current of the cell since it is difficult to form thinly the tunnel oxide film and the dielectric film. As a result, as it is difficult to read information from the main cell using the supply power, it is a general method to read information from the cell by stepping up the gate voltage of the cell using a word line boosting circuit, etc. In case of the CAM cell located in the peripheral circuit, however, there is a problem that the area of the peripheral circuit region is increased because the CAM cell must have additional boosting circuit for this stepping voltage. Also, there is a problem that the device could not be operated without time delay because additional time for reading information is required.

Further, capacitance is generated between respective elements of this flash memory cell. In other words, there are a capacitance Cg between the control gate and the floating gate, a capacitance Cs between the floating gate and the source, a capacitance Cb between the floating gate and the semiconductor substrate and a capacitance Cd between the floating gate and the drain. In order to read out information from the flash memory cell, a coupling ratio being a capacitance Cg between the control gate and the floating gate to the total capacitance must be about 0.55, which lowers the conductance of the cell. Thereby, the operating voltage of the memory device used as a control gate voltage as the threshold voltage of about 2.0V same to the main cell is lowered while the cell current is abruptly reduced, which makes difficult to read given cell information. Therefore, the cell threshold voltage is lowered to abut 0V through over-erasing the cell, thus allowing sensing of data from the CAM cell.

However, the conventional method may over-erase the cell and may thus cause a problem of storing information for a long time due to the leakage current of the cell and the like at various week operating environment such as high temperature or high voltage and the like. Further, in case of this CAM cell, if a manual test is returned to an initial state due to error when the test is performed, the conventional method has a lot of loss in time as the voltage must be lower again.

SUMMARY OF THE INVENTION

It is therefore an object of the present invention to provide a method of manufacturing a CAM cell that is driven at a low voltage, which does not increase the area of a peripheral circuit region depending on addition of a boosting circuit and can drive the devices without delay.

Another object of the present invention is to provide a method of manufacturing a CAM cell by which an initial state need not be reinitialized and data can be stably secured when a manual test on the CAM cell is performed.

Further another object of the present invention is to provide a method of manufacturing a CAM cell capable of solving the above conventional problems by using an ONO film used as a dielectric film in a flash memory cell as a gate oxide film.

In order to accomplish the above object, a method of manufacturing a CAM cell according to the present invention, is characterized in that it comprises the steps of forming a gate insulating film in which a plurality of oxide films and nitride films are stacked on a semiconductor substrate; forming a polysilicon film on the gate insulating film; etching given regions of the polysilicon film and the gate insulating film to form a gate; and performing impurity ion implantation process to form a source region and a drain region.

Further, a method of manufacturing a CAM cell according to the present invention is characterized in that it comprises the steps of forming a device isolation film in a given region on a semiconductor substrate to define an active region and a device isolation region; defining the active region into a cell region and a peripheral circuit region by a given process; forming a tunnel oxide film and a first polysilicon film on the entire structure and then patterning the tunnel oxide film and the first polysilicon film so that the tunnel oxide film and the first polysilicon film can only remain in a given region of the cell region, thus defining a floating gate; forming an insulating film in which the oxide film and the nitride film are stacked on the entire structure to form a second polysilicon film; patterning the second polysilicon film and the insulating film so that they can remain only in a given region of the cell region and the (distinct) peripheral circuit region, thus forming a control gate in the cell region, a gate in the peripheral circuit region; and performing an impurity ion implantation process for a given region of the semiconductor substrate to form a source region and a drain region, so that a flash memory cell is formed in the cell region and a code address memory cell is formed is the peripheral circuit region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
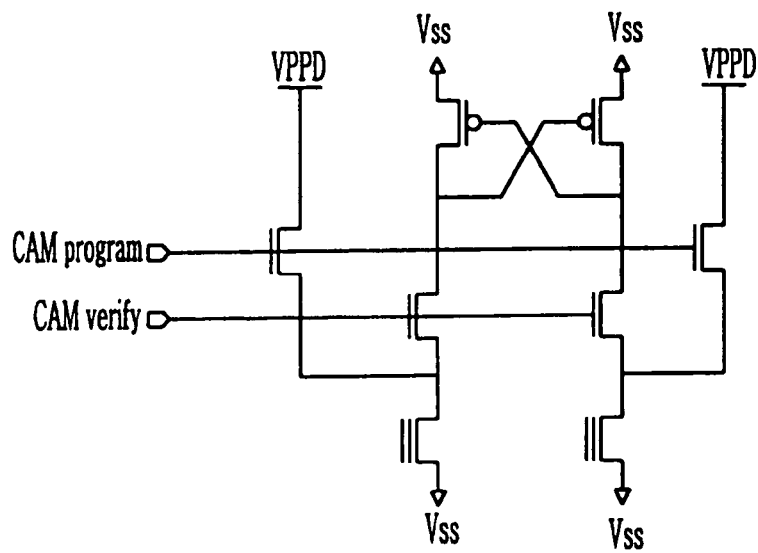
FIG. 1 is a circuit diagram of a common CAM cell.
Figure 2:
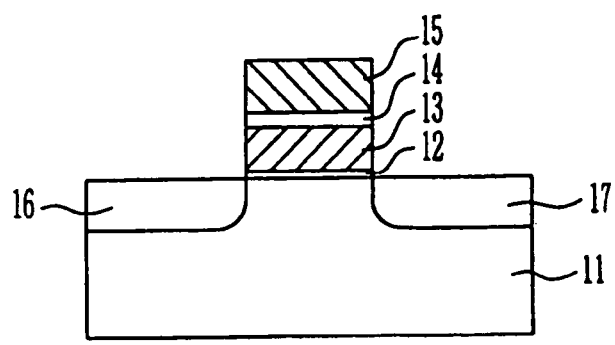
FIG. 2 is a cross-sectional view of a common flash memory cell that is simultaneously used as a main cell and a CAM cell.
Figure 3:
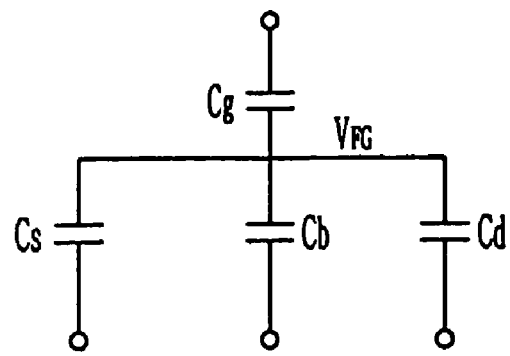
FIG. 3 is an equivalent circuit diagram representing the capacitance of the flash memory cell.

The present invention will be described in detail by way of a preferred embodiment with reference to accompanying drawings, in which like reference numerals are used to identify the same or similar parts.

Figure 4:
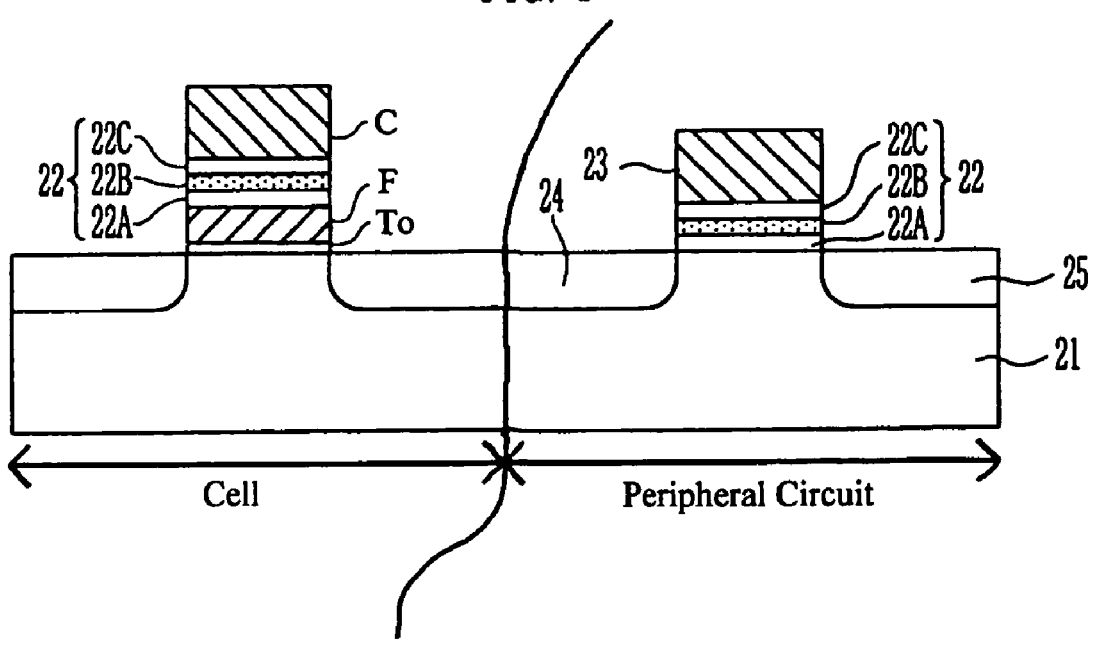
FIG. 4 is a cross-sectional view of a CAM cell according to the present invention.

Referring now to FIG. 4, there is shown a cross-sectional view of a memory device including a CAM cell in a peripheral circuit region and a flash memory in a cell region according to the present invention.

A tunnel oxide layer TO and a floating gate F are formed in a cell region of a semiconductor substrate 21. The floating gate F is formed with a first polysilicon layer. A gate insulating film 22 including an oxide film and a nitride film formed on a semiconductor substrate and the floating gate F. For example, the gate insulating film 22 has a second oxide film 22C, a nitride film 22B and a first oxide film 22A, which are sequentially stacked on the semiconductor substrate 21. The gate insulating film 22 is used as a dielectric film formed between the floating gate and the control gate in the process of manufacturing a flash memory cell. At this time, the thickness of the gate insulating film 22 is in the range of 30~300Å. For example, the gate insulating film 22 of a three layer has the first oxide film 22A, the nitride film 22B and the second oxide film 22C each of which has the thickness of 10~100Å. Meanwhile, the gate insulating film 22 may be formed using a stack structure of a first oxide film, a first nitride film, a second oxide film and a second nitride film, a stack structure of the first oxide film, the first nitride film, the second oxide film, the second nitride film and the third oxide film, and the like, as well of the stack structure of the first oxide film 22A, the nitride film 22B and the second oxide film 22C. Also, after forming a second polysilicon film on the gate insulating film 22, the second polysilicon film and the gate insulating film 22 are pattened. Thus, a gate 23 of an address memory is formed in the peripheral circuit region while a control gate C of the flash memory is formed in the cell region from the second polysilicon layer. And also, the gate insulating is left between the semiconductor substrate 21 and the gate 23 and between the floating gate F and the control gate C. A source region 24 and a drain region 25 are formed on the semiconductor substrate 21 by means of impurity ion implantation process.

Though the method of manufacturing the CAM cell has been described in the above, the CAM cell can be manufactured in a portion of the peripheral circuit region when the flash memory cell is formed in a cell region in the flash memory cell manufacture process. Therefore, the process of manufacturing the CAM cell will be described in conjunction with the process of manufacturing the flash memory cell.

Figure 5A:
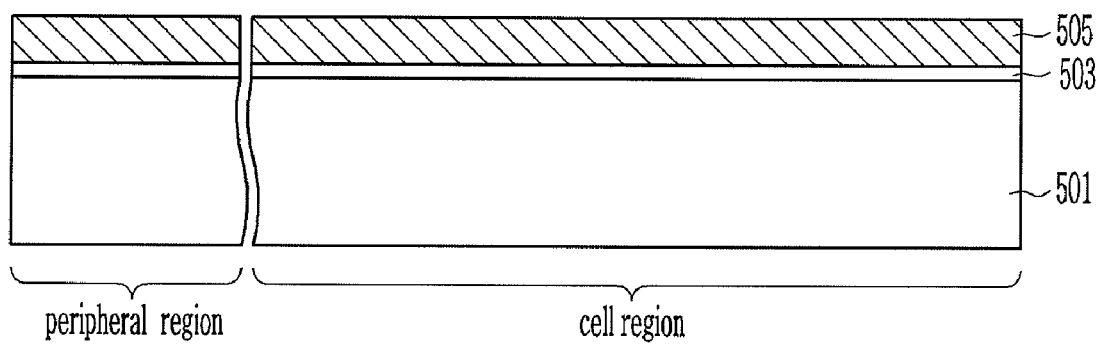
FIGS. 5A-5D are views depicting the peripheral region being located separately from the cell region.
Figure 5B:
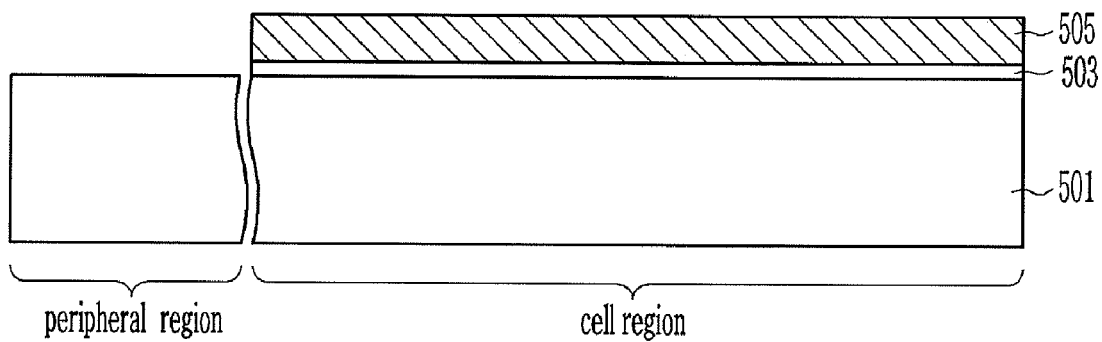
Figure 5C:
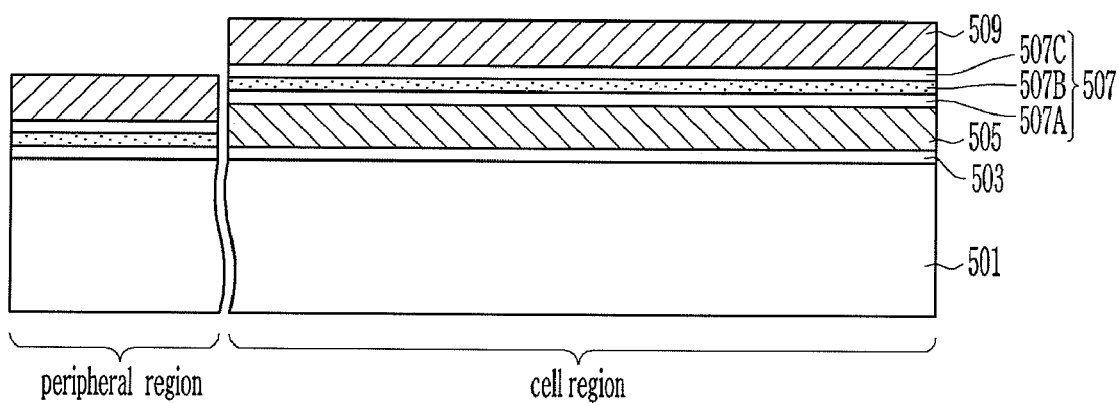
Figure 5D:
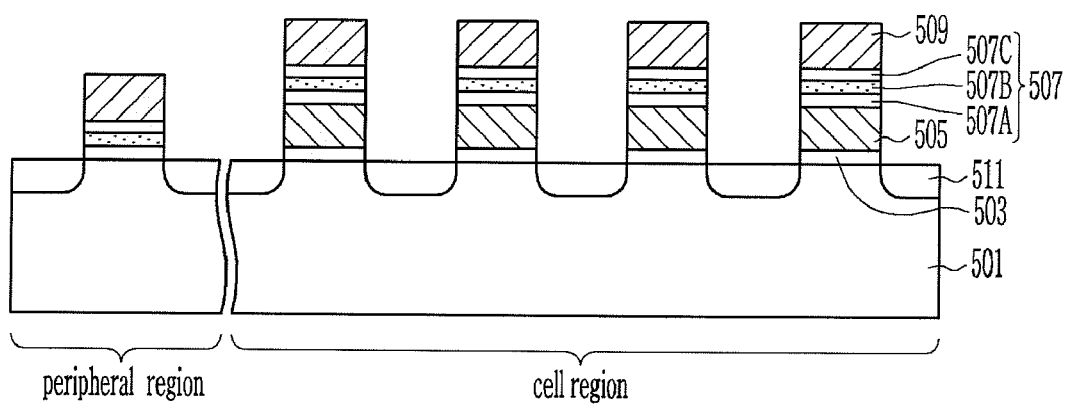

A device isolation film is formed on a given region of the semiconductor substrate to define an active region and a device isolation region. The active region is defined into a cell region and a peripheral circuit region by a given process. Then, a tunnel oxide film 503 and a first polysilicon film 505 are formed on the semiconductor substrate 501 including the cell region and the peripheral circuit region as shown in FIG. 5A. Next, the first polysilicon film 505 and the tunnel oxide film 503 are patterned by means of lithography and etch process using a mask through a given region of the cell region is exposed. Due to this, a floating gate is defined in the cell region, and the tunnel oxide film 503 and the first polysilicon film 505 formed in the peripheral circuit region are completely removed as shown in FIG. 5B. After an insulating film 507 in which at least two or more layers of an oxide film and a nitride film are stacked is formed on the entire structure, a second polysilicon film 509 is formed as shown in FIG. 5C. Referring in FIG. 5D, a pattering process from the second polysilicon film 509 to the tunnel oxide film 503 in the cell region is performed by means of lithography process and etch process using a mask through which a portion where the floating gate in the cell region is defined and a given portion of the peripheral circuit region are exposed, thus forming a stack gate in which the floating gate and the control gate are stacked. At this time, the second polysilicon film 509 and the stack insulating film 507 in the peripheral circuit region are etched to form a gate. Thereafter, source and drain are formed in given regions of the cell region and the peripheral circuit region by means of impurity ion implantation process. Therefore, the flash memory cell is formed in the cell region and the CAM cell according to the present invention is formed in the peripheral circuit region. At this time, the stack insulating film 507 is used as the dielectric film between the floating gate 505 and the control gate 509 in the cell region and is also used as a gate oxide film between the semiconductor substrate 501 and the gate 509 in the peripheral circuit region.

As can be understood from the above description, a CAM cell according to the present invention has advantages that it can be stably driven at a low operating voltage since it uses a dielectric film of the flash memory cell as a gate oxide film. Thus, the CAM cell can reduce the area occupied by a peripheral circuit region since it does not need additional boosting circuit. Also, though the conditions for a conventional CAM cell must be reset since the CAM cell is all initialized by UV erasure when it is again tested, the CAM cell according to the present invention need not to again set the conditions on the test. Further, the present invention can secure stable data since there is nothing changes until data is artificially changed in case of once repaired data.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a code address memory cell in a peripheral circuit region and a flash memory cell in a cell region, the method comprising:
    forming a tunnel oxide layer and a floating gate layer on a semiconductor substrate including a cell region and a distinct peripheral region;
    removing the floating gate layer and the tunnel oxide layer formed on the distinct peripheral region;
    forming a dielectric layer and a control gate layer on the cell region and the distinct peripheral circuit region of the semiconductor substrate, the dielectric layer including an oxide layer and a nitride layer;
    patterning the control gate layer, the dielectric layer, the floating gate layer and the tunnel oxide layer to form a stack gate on the cell region and a gate including the control gate layer and the dielectric layer on the distinct peripheral region; and
    forming a source and a drain region in the semiconductor substrate by performing an impurity ion implantation process.

2. The method of manufacturing the code address memory cell in the peripheral region and the flash memory cell in the cell region according to claim 1, wherein the dielectric layer is formed by stacking at least two or more layers of at least one of the oxide layer and the nitride layer.

3. The method of manufacturing the code address memory cell in the peripheral region and the flash memory cell in the cell region according to claim 1, wherein the dielectric layer is formed in thickness of about 30~300Å.

4. The method of manufacturing the code address memory cell in the peripheral region and the flash memory cell in the cell region according to claim 1, wherein the dielectric layer is formed by stacking a first oxide layer, a nitride layer and a second oxide layer.

5. The method of manufacturing the code address memory cell in the peripheral region and the flash memeory cell in the cell region according to claim 1, wherein the dielectric layer is formed by stacking a first oxide layer, a first nitride layer, a second oxide layer and a second nitride layer.

6. The method of manufacturing the code address memory cell in the peripheral region and the flash memory cell in the cell region according to claim 1, wherein the dielectric layer is formed by stacking a first oxide layer, a first nitride layer, a second oxide layer, a second nitride layer and a third oxide layer.

7. The method of manufacturing the code address memory cell in the peripheral region and the flash memory cell in the cell region according to claim 1, wherein the floating gate layer and the control gate layer is formed of polysilicon.

8. A method of manufacturing a code address memory cell in a peripheral circuit region and a flash memory cell in a cell region, the method comprising:
    forming a tunnel oxide layer and a floating gate layer on a semiconductor substrate including a cell region and a distinct peripheral region;
    removing the floating gate layer and the tunnel oxide layer formed on the distinct peripheral region;
    forming a dielectric layer and a control gate layer on the cell region and the distinct peripheral region of the semiconductor substrate, the dielectric layer including a first oxide layer, a first nitride layer, a second oxide layer, a second nitride layer and a third oxide layer;
    patterning the control gate layer, the dielectric layer, the floating gate layer and the tunnel oxide layer to form a stack gate on the cell region and a gate including the control gate layer and the dielectric layer on the distinct peripheral region; and
    forming a source and a drain region in the semiconductor substrate by performing an impurity ion implantation process.

9. The method of manufacturing the code address memory cell in the peripheral region and the flash memory cell in the cell region according to claim 8, wherein the floating gate layer and the control gate layer is formed of polysilicon.

* * * * *